United States Patent
Sai et al.

(10) Patent No.: US 10,404,269 B2
(45) Date of Patent: Sep. 3, 2019

(54) ANALOG-TO-DIGITAL CONVERTER AND SIGNAL PROCESSING APPARATUS

(71) Applicant: KABUSHIKI KAISHA TOSHIBA, Minato-ku (JP)

(72) Inventors: Akihide Sai, Yokohama (JP); Satoshi Kondo, Kawasaki (JP); Kentaro Yoshioka, Kawasaki (JP); Tetsuro Itakura, Nerima (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/920,611

(22) Filed: Mar. 14, 2018

(65) Prior Publication Data
US 2019/0068216 A1 Feb. 28, 2019

(30) Foreign Application Priority Data
Aug. 29, 2017 (JP) .................. 2017-164543

(51) Int. Cl.
*H03M 1/60* (2006.01)
*H03M 3/00* (2006.01)
*G04F 10/00* (2006.01)

(52) U.S. Cl.
CPC .......... *H03M 3/458* (2013.01); *G04F 10/005* (2013.01); *H03M 1/60* (2013.01); *G04F 10/00* (2013.01)

(58) Field of Classification Search
USPC ...................................................... 341/157
See application file for complete search history.

(56) References Cited

U.S. PATENT DOCUMENTS

| 3,678,500 A | * | 7/1972 | Bauer | G06G 7/161 |
| | | | | 341/157 |
| 6,388,248 B1 | * | 5/2002 | Gibbs | G06F 1/26 |
| | | | | 341/157 |
| 8,519,880 B2 | | 8/2013 | Kawaguchi et al. | |
| 2012/0154192 A1 | * | 6/2012 | Op 'T Eynde | H03M 1/0682 |
| | | | | 341/155 |

FOREIGN PATENT DOCUMENTS

JP 2012-244199 A 12/2012

OTHER PUBLICATIONS

Naiknaware et al., Time-Referenced Single-Path Multi-Bit Delta-Sigma ADC using a VCO-Based Quantizer, IEEE Transactions on Circuits and Systems—II: Analog and Digital Signal Processing, vol. 47, No. 7, Jul. 2000 (Year: 2000).*

(Continued)

*Primary Examiner* — Howard Williams
(74) *Attorney, Agent, or Firm* — Oblon, McClelland, Maier & Neustadt, L.L.P.

(57) ABSTRACT

An analog-to-digital converter has a switched capacitor comprising a capacitor to perform charging and discharging by switching a switch, the switched capacitor varying a charge amount of the capacitor in accordance with a frequency of an oscillation signal in accordance with a differential signal between an input signal and a feedback signal, capacitance of the capacitor, and a predetermined bias voltage, a feedback signal generator to generate the feedback signal based on an output signal of the switched capacitor, and a digital converter to generate a digital signal by digital conversion of the input signal based on the oscillation signal.

18 Claims, 8 Drawing Sheets

(56) References Cited

OTHER PUBLICATIONS

Waleed El-Halwagy, et al. "A programmable 8-bit, 10MHz BW, 6.8mW, 200MSample/sec, 70dB SNDR VCO-based ADC using SC feedback for VCO linearization", IEEE, 2013, pp. 157-160.
Neelakantan Narasimman, et al., "Design challenges for VCO based ADCs for ultra-low power operation", IEEE, 2013, pp. 249-252.
Luis Hernandez, et al., "Exploiting time resolution in Nanometre CMOS data converters", IEEE, 2010, pp. 1069-1072.
Muhammed Bolatkale, et al., "A 4 GHz Continuous-Time of $\Delta\Sigma$ ADC With 70 dB DR and -74 dBFS THD in 125 MHz BW", IEEE Journal of Solid-State Circuits, vol. 46, No. 12, Dec. 2011, pp. 2857-2868.
Matthew Park, et al., "A 78 dB SNDR 87 mW 20 MHz Bandwidth Continuous-Time $\Delta\Sigma$ ADC With VCO-Based Integrator and Quantizer Implemented in 0.13 μm CMOS", IEEE Journal of Solid-State Circuits, vol. 44, No. 12, Dec. 2009, pp. 3344-3358.

\* cited by examiner

ANALOG-TO-DIGITAL CONVERTER AND SIGNAL PROCESSING APPARATUS

CROSS REFERENCE TO RELATED APPLICATIONS

This application is based upon and claims the benefit of priority from the prior Japanese Patent Application No. 2017-164543, filed on Aug. 29, 2017, the entire contents of which are incorporated herein by reference.

FIELD

Embodiments relate to an analog-to-digital converter and a signal processing apparatus provided with the analog-to-digital converter.

BACKGROUND

A ΔΣ-type A/D converter utilizing a voltage-controlled oscillator (VCO) as an integrator has been proposed. This type of A/D converter has nonlinear characteristics in frequency change to a VCO voltage, which is a cause of resolution degradation. In order to solve this problem, techniques of calibrating the frequency nonlinearity by voltage sweeping, mitigating the nonlinearity using a D/A converter in a VCO negative-feedback loop, etc. have been proposed.

However, these improved techniques have a problem in that the A/D converter cannot operate rapidly and, in addition, power consumption and circuit area may increase.

DETAILED DESCRIPTION

According to one embodiment, an analog-to-digital converter has a switched capacitor comprising a capacitor to perform charging and discharging by switching a switch, the switched capacitor varying a charge amount of the capacitor in accordance with a frequency of an oscillation signal in accordance with a differential signal between an input signal and a feedback signal, capacitance of the capacitor, and a predetermined bias voltage, a feedback signal generator to generate the feedback signal based on an output signal of the switched capacitor, and a digital converter to generate a digital signal by digital conversion of the input signal based on the oscillation signal.

Hereinafter, embodiments will be explained with reference to the drawings. In the present specification and the accompanying drawings of the present specification, for easy understanding and simplicity of drawings, the explanation and the drawings are made with part of the configuration being omitted, modified or simplified. However, the technical contents to the extent that a similar function can be expected will be interpreted to be included in the embodiments.

First Embodiment

Figure 1:
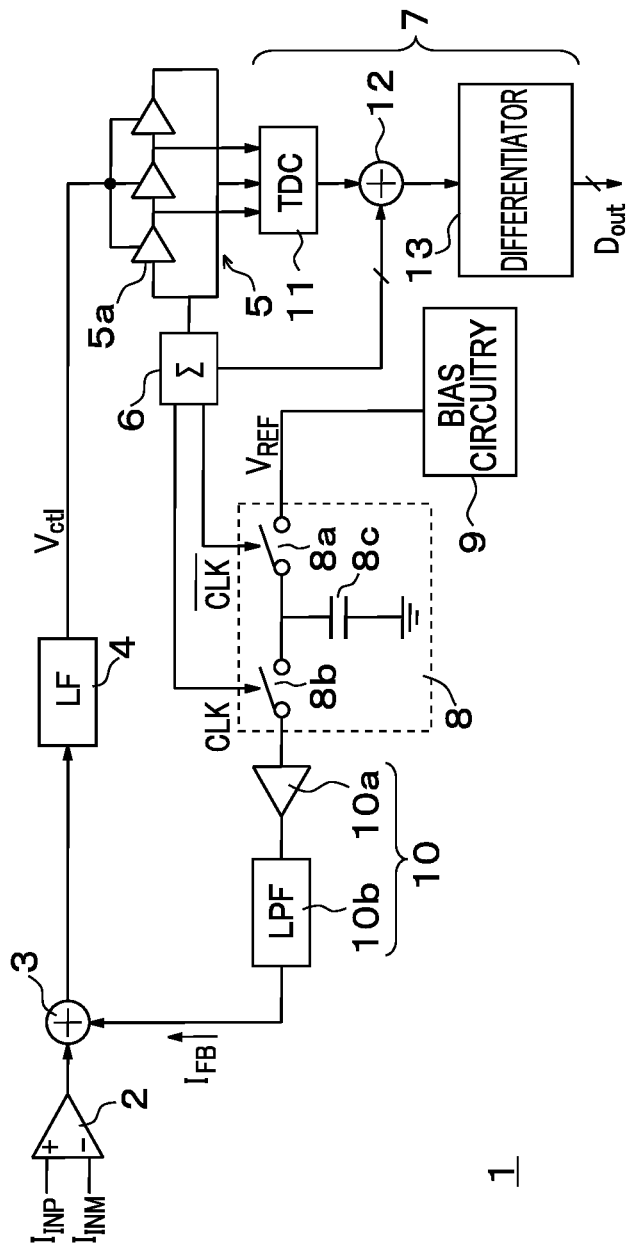
FIG. 1 is a block diagram showing an internal configuration of an analog-to-digital converter according to a first embodiment.

FIG. 1 is a block diagram showing an internal configuration of an analog-to-digital converter 1 according to a first embodiment. The analog-to-digital converter 1 of FIG. 1 is a ΔΣ-type A/D converter. The analog-to-digital converter 1 of FIG. 1 converts an input signal into a digital signal. It is a precondition that the input signal is an analog current signal which may be a current signal of any frequency and amplitude. In the example of FIG. 1, a differential current signal of differential current signals $I_{INP}$ and $I_{INM}$ input to a two-input current buffer 2 is output from a current buffer 2, and then the differential current signal is input, as an input signal, to the analog-to-digital converter 1. The differential current signals $I_{INP}$ and $I_{INM}$ input to the current buffer 2 are current signals of inverted polarities. The two-input current buffer 2 is just an example. Not the differential current signals, but a single current signal may be input to the analog-to-digital converter 1.

The input signal input to the analog-to-digital converter 1 of FIG. 1 is an output signal of any electric equipment that outputs a current. For example, an output signal of several types of sensors that are a current-output type may be the input signal of the analog-to-digital converter 1 of FIG. 1, which is, in a more specific example, an output signal of a photoelectric converter such as a photodiode and a photomultiplier tube.

The analog-to-digital converter 1 of FIG. 1 is provided with a differential signal generator 3, a loop filter 4, a ring oscillator 5, a counter 6, a digital converter 7, a switched capacitor 8, bias circuity 9, and a feedback signal generator 10.

The differential signal generator 3 generates a differential signal between an input signal and a feedback signal. The differential signal is also a current signal. The loop filter 4 removes unnecessary frequency components contained in the differential signal to output a voltage signal $V_{ctl}$ in accordance with the differential signal. As described later, the analog-to-digital converter 1 according to the present embodiment is provided with a negative-feedback path. Although, it is desirable to remove spurious components contained in a feedback signal generated in the negative-feedback path to improve a negative-feedback loop gain, the performance of the loop filter 4 is important for that purpose. The loop filter 4 can have any internal configuration, for example, an integrator and an amplifier may be provided before and after the loop filter 4 in order to improve the negative-feedback loop gain. Moreover, the loop filter 4 may be a transimpedance element for converting the differential signal from the differential signal generator 3 into a voltage signal, and the value of the transimpedance element may be adjusted to improve the negative-feedback loop gain.

The ring oscillator 5 is a voltage-controlled oscillator (VCO) configured with an odd number of delay elements 5a connected one another in a ring. Based on the voltage signal output from the loop filter 4, the ring oscillator 5 controls the frequency of an oscillation signal. The ring oscillator 5 varies the frequency of the oscillation signal in accordance with the voltage signal, and as its result, varies the phase of the oscillation signal. Since the phase is an integrated value of the frequency, the ring oscillator 5 functions as an integrator from the point of view of phase. In other words, the ring oscillator 5 functions as an integrator Σ in a ΔΣ-type A/D converter.

The oscillation signal of the ring oscillator 5 is input to the counter 6 and the digital converter 7. The counter 6 performs counting in synchronism with the oscillation signal of the ring oscillator 5. The counter 6 counts a cycle number of the oscillation signal. The count number is integral phase information. Moreover, the counter 6 generates a frequency division signal that is obtained by dividing the frequency of the oscillation signal.

Based on the oscillation signal of the ring oscillator 5, the digital converter 7 converts an input signal by digital conversion to generate a digital signal. The digital converter 7 has a time-to-digital converter (TDC) 11, an adder 12, and a differentiator 13.

The TDC 11 detects decimal phase information of the oscillation signal of the ring oscillator 5. In more detail, the TDC 11 detects the decimal phase information based on a phase difference between the oscillation signal of the ring oscillator 5 and a reference signal. The adder 12 adds an output signal of the counter 6 and an output signal of the TDC 11. In other words, the adder 12 adds integral phase information and the decimal phase information of the ring oscillator 5 to generate phase information. For example, in the case where the counter 6 outputs six bits and the TDC 11 outputs an output signal of four bits, the adder 12 generates a digital signal in 10-bit resolution.

The differentiator 13 performs a differentiation process to an output signal of the adder 12. In detail, the differentiator 13 converts phase information of the ring oscillator 5 into frequency information. The counter 6, the TDC 11, and the differentiator 13 function as a quantizer in the ΔΣ-type A/D converter.

The bias circuity 9 generates a bias voltage of a predetermined D.C. voltage level. The bias voltage generated by the bias circuity 9 is supplied to the switched capacitor 8. The bias voltage may be supplied from the outside of the analog-to-digital converter 1. In this case, the bias circuity 9 is not required to be provided inside the analog-to-digital converter 1.

The switched capacitor 8 is connected on a negative-feedback path that feeds back the oscillation signal of the ring oscillator 5 to the input side. The ring oscillator 5 shows nonlinear frequency change to voltages. The nonlinearity is a cause of lowering the resolution of the analog-to-digital converter 1. However, the resolution can be improved by providing the switched capacitor 8 on the negative-feedback path to feed back a feedback signal to the input side.

The reason for providing the switched capacitor 8 in the present embodiment is that the switched capacitor 8 can convert the oscillation signal frequency of the ring oscillator 5 into a current directly as having an analog value, at a high speed and at high performance. If a D/A converter is used instead of the switched capacitor 8, the number of bits of the D/A converter is required to be increased to perform D/A conversion at high accuracy, however, the D/A converter becomes bulky in circuit scale. By contrast, the switched capacitor 8 can generate an analog current signal at a high speed and at high performance, with a small circuit area.

The switched capacitor 8 has two switches 8a and 8b that are turned on or off alternately and a capacitor 8c. The switches are turned on or off by the frequency division signal output from the counter 6. The charge amount of the capacitor 8c varies in accordance with the frequency of the frequency division signal that is the frequency of the oscillation signal, the capacitance of the capacitor 8c, and the bias voltage from the bias circuity 9. The switched capacitor 8 generates a current signal in accordance with the bias voltage and the charge amount of the capacitor 8c.

The feedback signal generator 10 is provided with, for example, a current buffer 10a and a low-pass filter 10b. The current buffer 10a buffers the current signal output from the switched capacitor 8 and supplies the buffered current signal to the low-pass filter 10b. The low-pass filter 10b removes spurious components contained in the current signal output from the current buffer 10a to generate a feedback signal. The feedback signal output from the low-pass filter 10b is input to the differential signal generator 3.

Figure 2A:
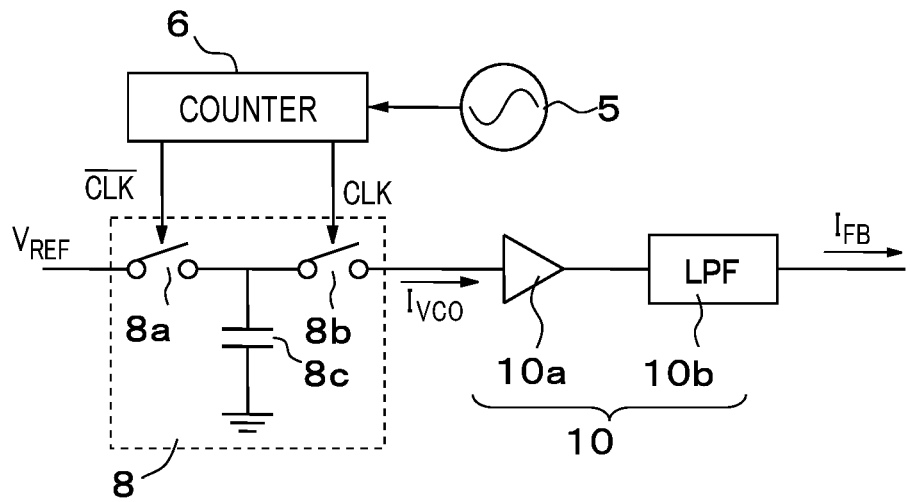
FIG. 2A is a diagram for explaining an operation of a switched capacitor.
Figure 2B:
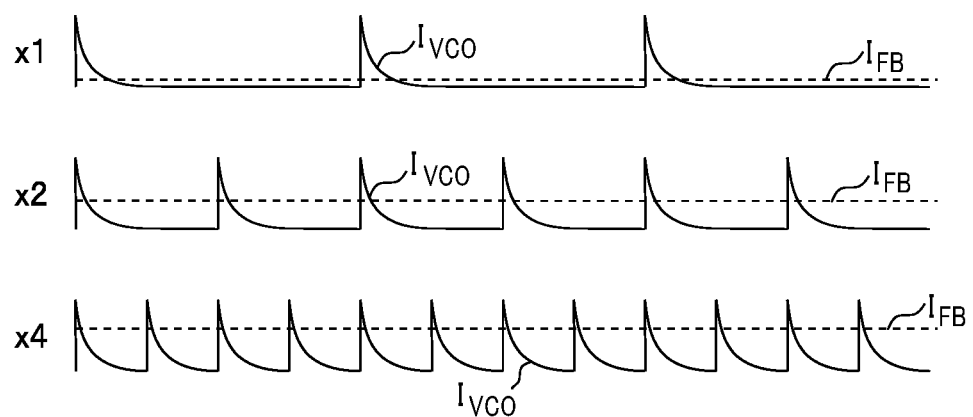
FIG. 2B is an output current-waveform diagram of a switched capacitor and a low-pass filter.

FIG. 2A is a diagram for explaining an operation of the switched capacitor 8. FIG. 2B is an output current-waveform diagram of the switched capacitor 8 and the low-pass filter 10b.

The counter 6 counts a cycle number of the oscillation signal of the ring oscillator 5 in six bits, for example. Although the counter 6 can have any number of bits, the following explanation will be made with six bits. Each of the six bits is a frequency division signal obtained by dividing the oscillation signal of the ring oscillator 5 in frequency division, having a different frequency division ratio per bit. In the present embodiment, a frequency division signal of the counter 6, having a predetermined number of bits, and its inverted signal are used for switching the switches of the switched capacitor 8. In more detail, the two switches 8a and 8b in the switched capacitor 8 are turned on or off in accordance with the frequency division signal. For example, when a frequency division signal /CLK is high, the switch 8a is turned on, so that the bias voltage from the bias circuity 9 passes through the switch 8a and is applied to the capacitor 8c to charge the capacitor 8c. While charging, a frequency division signal CLK is low to turn off the switch 8b, so that the switched capacitor 8 does not output a current signal. On the contrary, when the frequency division signal CLK is high whereas the frequency division signal /CLK is low, the switch 8a is turned off to complete the charging to the capacitor 8c whereas the switch 8b is turned on, so that a discharge current from the capacitor 8c flows to the current buffer 10a.

As shown in FIG. 2B, the frequency division signals CLK and /CLK are rectangular signals whereas a discharge current $I_{VCO}$ that flows from the capacitor 8c to the current buffer 10a is a spike current that instantaneously rises to its peak and then gradually lowers. This current $I_{FB}$ passes through the current buffer 10a and the low-pass filter 10b. Therefore, as shown by a broken-line waveform in FIG. 2Ba, spike portions of the current $I_{FB}$ are ideally removed.

By changing the frequency division ratio of the frequency division signal output from the counter 6, the cycle of the discharge current $I_{VCO}$ from the capacitor 8c changes as shown in FIG. 2B. In FIG. 2B, a frequency division signal of the same frequency division ratio as the oscillation signal is denoted as x1, a frequency division signal of a frequency one-half that of the oscillation signal (a frequency division ratio of 2) is denoted as x2, and a frequency division signal of a frequency one-fourth that of the oscillation signal (a frequency division ratio of 4) is denoted as x4. As the frequency division ratio is lower, the discharge current $I_{VCO}$ has a shorter cycle, and the current $I_{FB}$ output from the low-pass filter 10*b* has a higher D.C. voltage level. As described above, by changing the frequency division ratio of the frequency division signal output from the counter 6, the discharge cycle of the capacitor 8*c* is changed, so that the D.C. voltage level of the feedback signal $I_{FB}$ can be adjusted to a most appropriate level.

The two switches 8*a* and 8*b* in the switched capacitor 8 are rapidly turned on or off in synchronism with the frequency division signal. The capacitor 8*c* in the switched capacitor 8 is charged and discharged at a high speed by the turn-on/off of the switches 8*a* and 8*b*. Therefore, the switched capacitor 8 can control the output current $I_{VCO}$ in synchronism with the frequency division signal with excellent followability.

For the frequency division ratio of the frequency division signal supplied from the counter 6 to the switched capacitor 8, adequate frequency division ratios may be set separately in mass production of the analog-to-digital converter 1 in view of variations in the production. Or under control by a controller not shown, the frequency division ratio may be changed programmably. Moreover, by switching a DIP switch or the like, a user may set or change the frequency division ratio as required.

The switched capacitor 8 according to the present embodiment functions in the same manner as a D/A converter connected to the negative-feedback path, as equivalent circuitry. As the accuracy is raised, the D/A converter has a larger area and consumes more power. By contrast, the switched capacitor 8 can be configured only with two switches 8*a* and 8*b*, and one capacitor 8*c* to reduce its area drastically compared with the D/A converter, excellent in accuracy and speed, capable of generating a feedback signal at an extremely high speed and high accuracy.

As described above, in the first embodiment, the switched capacitor 8 is provided, instead of the D/A converter, on the negative-feedback path of the ΔΣ-type A/D converter provided with the ring oscillator 5, the TDC 11, and the differentiator, and hence can generate a feedback signal at a high speed and high accuracy, with a small area, to improve the resolution of the analog-to-digital converter 1. The differential signal generator 3 generates the differential signal between the input signal and the feedback signal, and then the loop filter 4 converts the differential signal into the voltage signal to change the oscillation signal frequency of the ring oscillator 5, so that the oscillation signal frequency of the ring oscillator 5 can follow the input signal at high accuracy. Therefore, even if the input signal frequency changes, the differentiator 13 can output a high resolution digital signal that follows the change.

Second Embodiment

In the example of the above-described first embodiment, an input signal that is a current signal is converted by analog-to digital conversion. However, the input signal may be a voltage signal.

Figure 3:
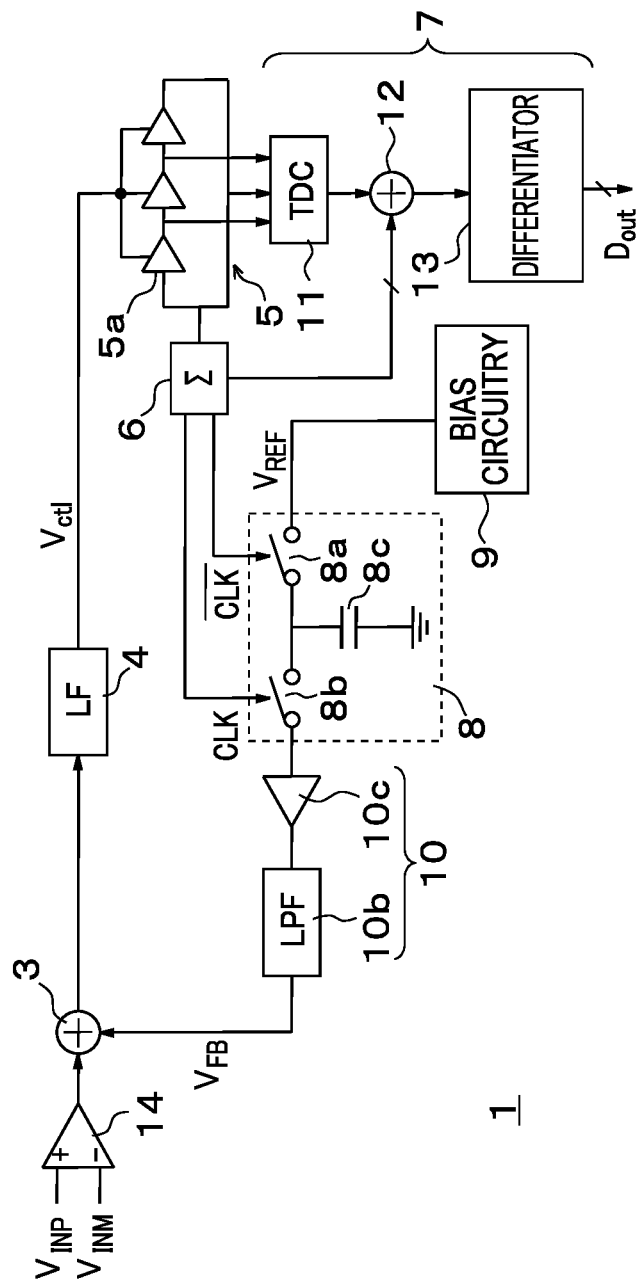
FIG. 3 is a block diagram showing an internal configuration of an analog-to-digital converter according to a second embodiment.

FIG. 3 is a block diagram showing an internal configuration of an analog-to-digital converter 1 according to a second embodiment. The analog-to-digital converter 1 of FIG. 3 converts an input signal that is a voltage signal by analog-to digital conversion. In FIG. 3, the same elements as those in FIG. 1 are given the same reference signs, the different points from FIG. 1 being mainly explained hereinafter.

The analog-to-digital converter 1 of FIG. 3 is provided with a voltage buffer 14 that outputs a differential voltage signal between two kinds of voltage signals, and a transimpedance amplifier 10*c* connected to the output side of the switched capacitor 8.

Although the voltage buffer 14 of FIG. 3 is a two-input type, a voltage buffer 14 for buffering a single voltage signal may be used. The input signal input to the analog-to-digital converter 1 of FIG. 3 is an output signal of any electric equipment that outputs a voltage. For example, an output signal of several types of sensors that are a voltage-output type may be the input signal of the analog-to-digital converter 1, which is, in a more specific example, a pixel signal of an imaging sensor.

The differential signal generator 3 in the latter stage of the voltage buffer 14 outputs a differential signal between an output voltage of the voltage buffer 14 and a feedback signal that is a voltage signal. The loop filter 4 removes unnecessary frequency components contained in the differential signal to output a voltage signal in accordance with the differential signal. The ring oscillator 5, the counter 6, the TDC 11, the adder 12, the differentiator 13, and the switched capacitor 8 operate in the same manner as those of FIG. 1.

A current signal output from the switched capacitor 8 is input to the transimpedance amplifier 10*c*. Since a voltage signal is input to the analog-to-digital converter 1 of FIG. 3, the current signal output from the switched capacitor 8 is converted into a voltage signal by the transimpedance amplifier 10*c*. Then, the differential signal generator 3 generates a differential voltage between a voltage signal output from the voltage buffer 14 and a voltage signal fed back from the transimpedance amplifier 10*c* via the low-pass filter 10*b* and supplies the differential voltage to the loop filter 4.

As described above, in the second embodiment, even in the case where a voltage signal is input, in the same manner as the first embodiment, the switched capacitor 8 is provided instead of the D/A converter on the negative-feedback path of the ΔΣ-type A/D converter, and hence a feedback signal can be generated at a high speed and high accuracy, with a small area, thereby improving the resolution of the analog-to-digital converter 1. The analog-to-digital converter 1 according to the second embodiment can be utilized for digital conversion of an output signal of several types of electric equipment that are a voltage-output type.

Third Embodiment

As shown in FIG. 2B, the output current of the switched capacitor 8 is a spike current that instantaneously rises to its peak and then gradually lowers, in synchronism with the frequency division signal. When the output current of the switched capacitor 8 passes through the current buffer 10*a* and the low-pass filter 10*b* of FIG. 1, the output current must ideally become a feedback signal having a D.C. current waveform. However, actually the feedback signal contains spurious components based on the spick current. When the feedback signal contains the spurious components, it causes change in oscillation signal frequency of the ring oscillator 5, which lowers analog-to-digital conversion accuracy.

Figure 4:
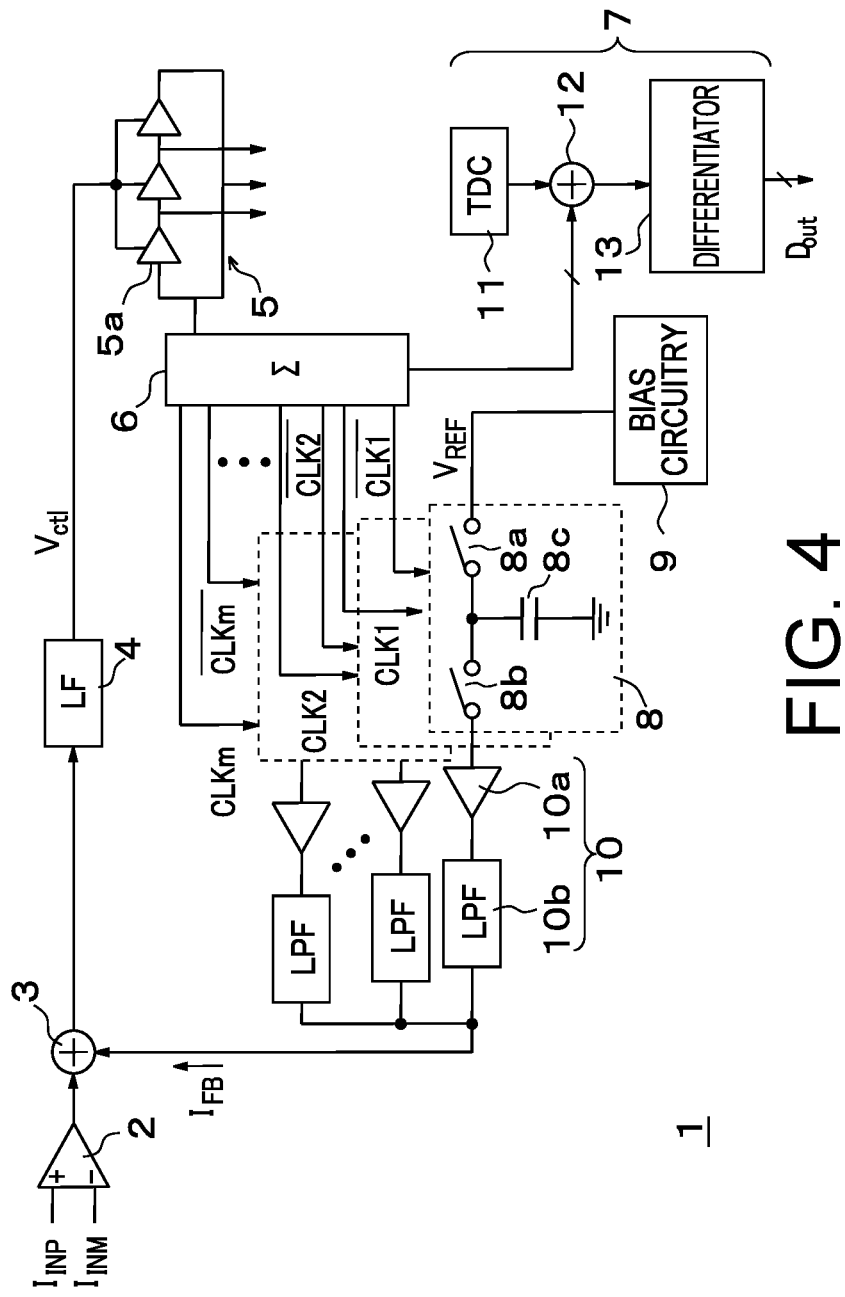
FIG. 4 is a block diagram of an analog-to-digital converter according to a third embodiment.

FIG. 4 is a block diagram of an analog-to-digital converter 1 according to a third embodiment. The analog-to-digital converter 1 of FIG. 4 restricts spurious components contained in a feedback signal. The analog-to-digital converter 1 of FIG. 4 is a partially-modified version of that in FIG. 1, the different points being mainly explained hereinafter.

The analog-to-digital converter 1 of FIG. 4 is provided with an m number (m being an integer of two or more) of switched capacitors 8, the m number of current buffers 10a, and the m number of low-pass filters 10b. The output signals of the m number of low-pass filters 10b are combined one another to be generated as a feedback signal.

Figure 5:
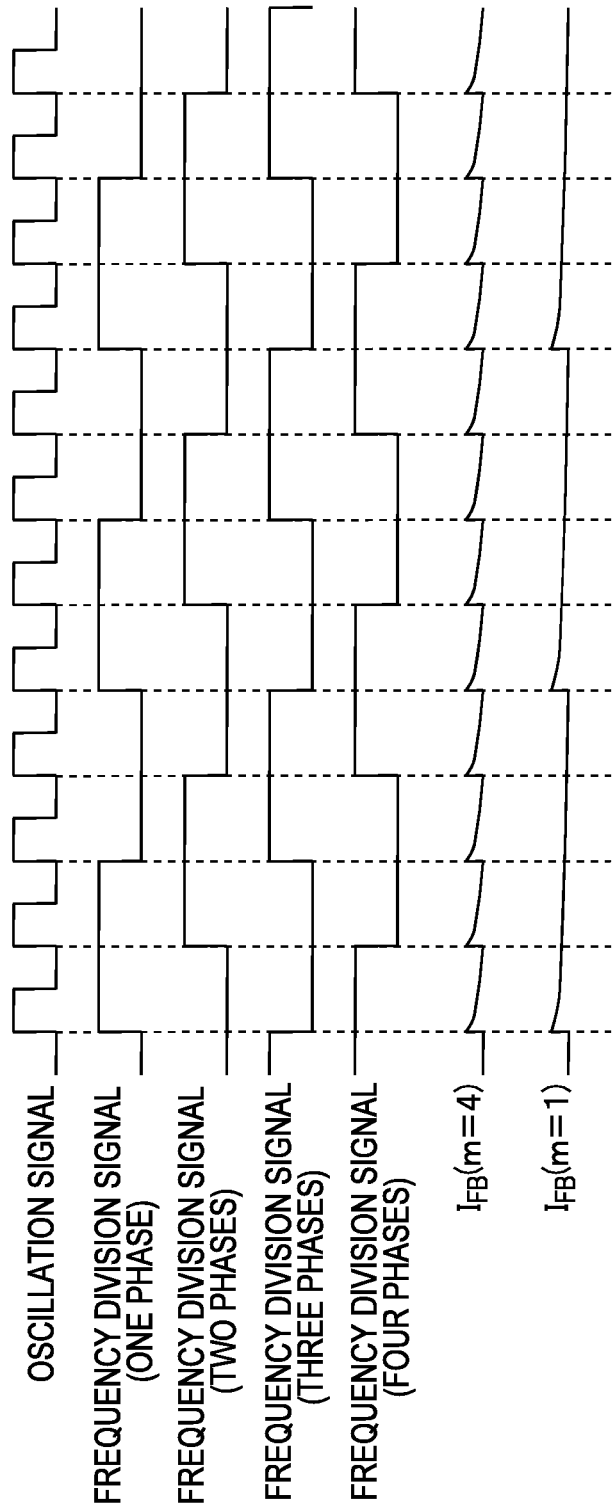
FIG. 5 is a signal waveform diagram of frequency division signals in m phases from a counter and a feedback signal that is obtained by combining output currents of an m number of low-pass filters.

The counter 6 supplies frequency division signals in each different phase to the m number of low-pass filters 10b. FIG. 5 is a signal waveform diagram of frequency division signals in m phases from the counter 6 and a feedback signal that is obtained by combining output currents of the m number of low-pass filters 10b. FIG. 5 shows an example in which, at m=4, the counter 6 supplies frequency division signals in four phases, which are obtained by dividing an oscillation signal of the ring oscillator 5 in frequency division, to four switched capacitors 8. Moreover, FIG. 5 shows a signal waveform of a feedback signal $I_{FB}$ at m=1. FIG. 5 shows spurious components contained in the feedback signal $I_{FB}$ in an emphasized manner.

As shown in FIG. 5, the m number of low-pass filters 10b is provided to supply with frequency division signals in each different phase. Therefore, the m number of switched capacitors 8 output (discharge) currents at a frequency that is obtained by multiplying the frequency of the frequency division signal by m. This results in that spurious components of the feedback signal $I_{FB}$ appear at the frequency obtained by multiplying the frequency of the frequency division signal by m. That is, the analog-to-digital converter 1 of FIG. 4 can raise the frequency of the spurious-components, so that the loop filter 4 can easily remove the spurious components. In other words, by optimizing the value of m, the feedback signal can be set at a frequency at which the loop filter 4 can most remove the spurious components.

Figure 6:
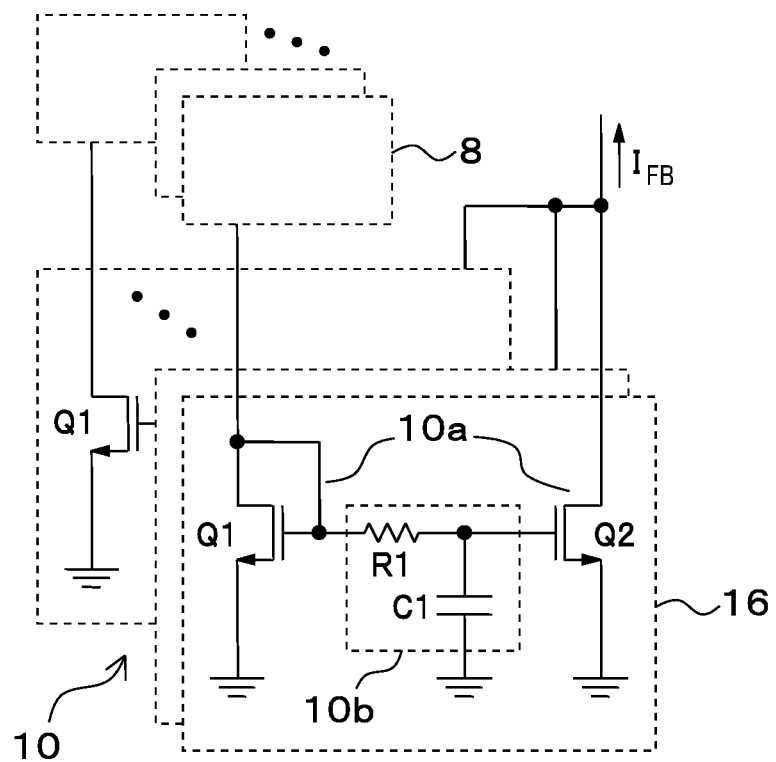
FIG. 6 is a circuit diagram of a specific example of the m number of current buffers and the m number of low-pass filters in FIG. 5.

FIG. 6 is a circuit diagram of a specific example of the m number of current buffers 10a and the m number of low-pass filters 10b in FIG. 5. As shown in FIG. 6, the m number of current buffers 10a has the m number of pieces of current miller circuitry 16. Each current miller circuitry 16 has a first transistor Q1 that passes therethrough a current output from an output node of the corresponding switched capacitor 8, a second transistor Q2 that passes therethrough a current proportional to the current flowing through the first transistor Q1, and a low-pass filter 10b connected between the gates of the first and second transistors Q1 and Q2. The drains of the m number of second transistors Q2 in the m number of pieces of current miller circuitry 16 are connected to one another, drain currents thereof being combined to be generated as a feedback signal $I_{FB}$.

It is easy for each current miller circuitry 16 to secure a band width and also to be designed compared to a current buffer 10a using an operational amplifier. The internal configuration of the current buffers 10a may not be the circuitry shown in FIG. 6, which may be configured with, for example, an operational amplifier.

The low-pass filter 10b of FIG. 6 has a resistor R1 connected between the gates of the first and second transistors Q1 and Q2, and a capacitor C1 connected between the gate of the second transistor Q2 and a ground node.

As described above, in the third embodiment, the digital-to-analog converter according to the first embodiment is partially modified to be provided with the m number of switched capacitors 8, the m number of current buffers 10a, and the m number of low-pass filters 10b, to operate the m number of switched capacitors 8 by shifting the time. Therefore, the frequency of the spurious components contained in the feedback signal $I_{FB}$ can be raised to easily remove the spurious components by the m number of low-pass filters 10b and by the loop filter 4. Accordingly, the spurious components contained in the output signal of the loop filter 4 can be restricted to stabilize the oscillation signal frequency of the ring oscillator 5.

Fourth Embodiment

In a fourth embodiment, a measure of reducing spurious components is taken to the digital-to-analog converter according to the second embodiment, in the same manner as the third embodiment.

Figure 7:
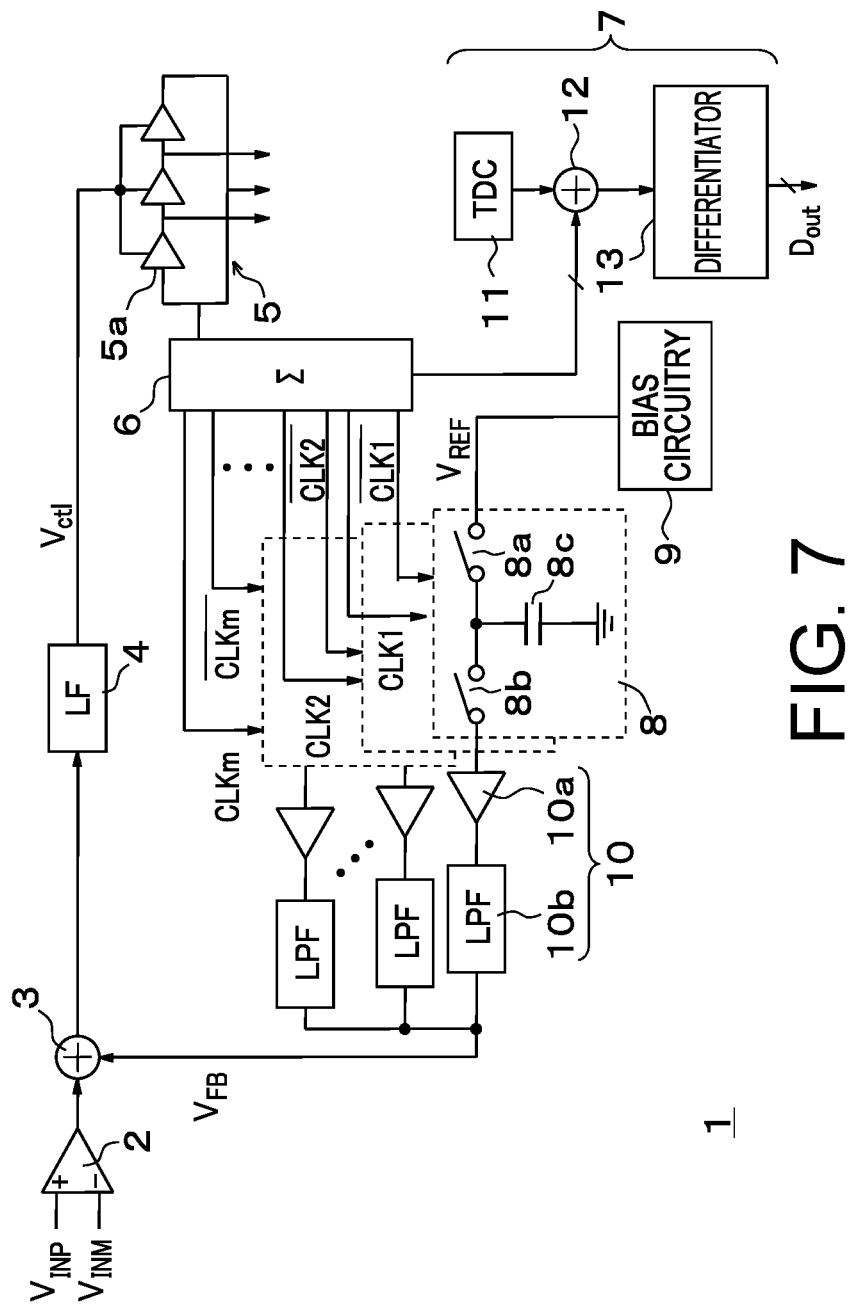
FIG. 7 is a block diagram of an analog-to-digital converter according to a fourth embodiment.

FIG. 7 is a block diagram of an analog-to-digital converter 1 according to the fourth embodiment. In the same manner as shown in FIG. 4, the analog-to-digital converter 1 of FIG. 7 is provided with an m number (m being an integer of two or more) of switched capacitors 8, the m number of current buffers 10a, and the m number of low-pass filters 10b. The output signals of the m number of low-pass filters 10b are combined to one another to generate a feedback signal. In FIG. 3, the transimpedance amplifier 10c is connected to the latter stage of the switched capacitor 8, whereas in FIG. 7, the current buffers 10a are connected thereto, in the same manner as that in FIG. 6.

Figure 8:
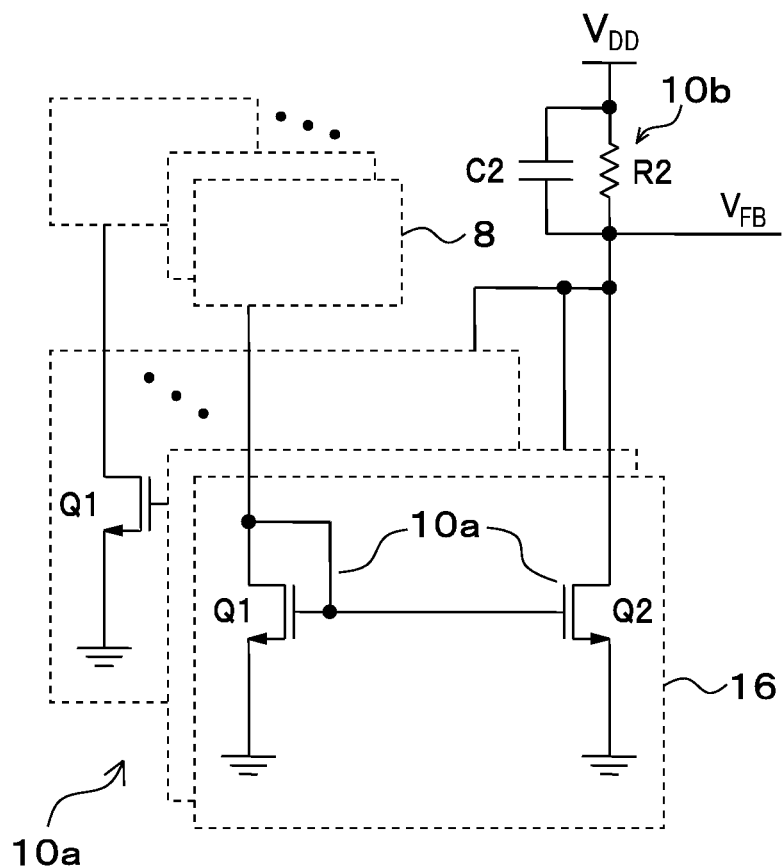
FIG. 8 is a circuit diagram of a specific example of the m number of current buffers and the m number of low-pass filters in FIG. 7.

FIG. 8 is a circuit diagram of a specific example of the m number of current buffers 10a and the m number of low-pass filters 10b in FIG. 7. Each current buffer 10a of FIG. 8 is current miller circuitry 16 in the same manner as that in FIG. 6, whereas each low-pass filter 10b of FIG. 8 has a different internal configuration from that of FIG. 6. The low-pass filter 10b of FIG. 8 has a resistor R2 and a capacitor C2 connected in parallel between the drain of a second transistor Q2 and a power supply node $V_{DD}$.

In FIG. 6, the m number of low-pass filters 10b are required, whereas in FIG. 8, the same low-pass filter 10b is connected to the m number of current buffers 10a, which makes the low-pass filter 10b compact. From a connection node between one end of the parallel-connected resistor R2 and capacitor C2, and a common output node of the m number of current buffers 10a, a feedback signal $V_{FB}$ is output and then input to a differential signal generator 3.

The parallel-connected resistor R2 and the capacitor C2 that configure the low-pass filter 10b convert the total currents output from the m number of pieces of current miller circuitry 16 into a voltage.

As described above, in the fourth embodiment, the digital-to-analog converter according to the second embodiment is partially modified to be provided with the m number of switched capacitors 8, the m number of current buffers 10a, and the m number of low-pass filters 10b, to operate the m number of switched capacitors 8 by shifting the time. Therefore, the frequency of the spurious components contained in the feedback signal $I_{FB}$ can be raised to easily remove the spurious components by the m number of low-pass filters 10b and by the loop filter 4. Accordingly, the spurious components contained in the output signal of the loop filter 4 can be reduced to stabilize the oscillation signal frequency of the ring oscillator 5.

Figure 9:
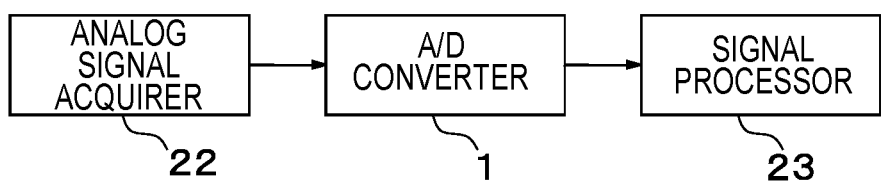
FIG. 9 is a block diagram schematically showing a configuration of a signal processing apparatus provided with the analog-to-digital converter according to any one of the first to fourth embodiments.

The analog-to-digital converters 1 according to the above-described first to fourth embodiments can be applied to digital conversion of a variety of kinds of analog signals. FIG. 9 is a block diagram schematically showing a configuration of a signal processing apparatus 21 provided with the analog-to-digital converter 1 according to any one of the first to fourth embodiments. The signal processing apparatus of FIG. 9 is provided with an analog signal acquirer 22, the analog-to-digital converter 1 according to any one of the first to fourth embodiments, and a signal processor 23.

The analog signal acquirer 22 is, for example, a sensor of a variety of types outputting an analog current or voltage signal. There is no particular limitation on the target to be sensed by the sensor. However, the sensor is, for example, an image sensor to output an image signal, an environmental sensor to output environmental information such as temperature and humidity, or a photo-sensor to receive a reflected-light signal from a target to convert it into an electrical signal.

The signal processor 23 performs a variety of kinds of signal processing based on a digital signal converted by the analog-to-digital converter 1. There is no particular limitation on the signal processing performed by the signal processor 23. However, when, for example, a digital signal in accordance with a reflected-light signal from a target is input to the signal processor 23, the signal processor 23 may perform a process of calculating a time difference between a small timing of a light signal radiated onto the target and a timing of a peak value of a reflected-light signal and, based on the calculated time difference, estimating the distance to the target. Moreover, the signal processor 23 may perform a process of imaging the distance to a plurality of surrounding targets.

As described above, the analog-to-digital converters 1 according to the first to fourth embodiments can be used in a variety of signal processing.

The analog-to-digital converters 1 according to the first to fourth embodiments may be configured with hardware only or at least part of the analog-to-digital converters 1 may be configured with software.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An analog-to-digital converter comprising:
a plurality of switched capacitors comprising capacitors to charge or discharge according to switching of switches, the switched capacitors varying charge amount of the capacitor in accordance with (1) a frequency of an oscillation signal in accordance with a differential signal between an input signal and a feedback signal, (2) capacitance of the capacitors, and (3) a bias voltage;
a feedback signal generator to generate the feedback signal based on output signals of the switched capacitors;
a digital converter to generate a digital signal by digital conversion of the input signal based on the oscillation signal;
a differential signal generator to generate the differential signal;
an oscillator to generate the oscillation signal having a frequency in accordance with the differential signal; and
a frequency divider to generate frequency division signals having a frequency equal to or lower than the frequency of the oscillation signal to supply the frequency division signals to the switched capacitors, the frequency division signals having different phases.

2. The analog-to-digital converter of claim 1, wherein the switched capacitors output currents in accordance with the bias voltage and the charge amount of the capacitors, as the output signal, and
the feedback signal generator generates the feedback signal based on the currents output from the switched capacitors.

3. The analog-to-digital converter of claim 1 further comprising:
wherein the switched capacitors repeat the charging and discharging of the capacitors in accordance with the frequencies of the frequency division signals.

4. The analog-to-digital converter of claim 3, wherein the frequency divider is a counter to generate the frequency division signal and to measure a cycle number of the oscillation signal as integral phase information, and
the digital converter comprises:
a time-to-digital converter to detect decimal phase information of the oscillation signal;
an adder to add the integral phase information and the decimal phase information; and
a differentiator to convert an output signal of the adder into frequency information.

5. The analog-to-digital converter of claim 1, wherein the input signal is a current signal,
the feedback signal generator generates the feedback signal comprising a current signal,
the differential signal generator generates the differential signal comprising a current signal, and
the analog-to-digital converter further comprising a loop filter to generate a voltage signal in accordance with the differential signal,
wherein the oscillator generates the oscillation signal having a frequency in accordance with the voltage signal.

6. The analog-to-digital converter of claim 1 further comprising a transimpedance amplifier to convert currents output from the switched capacitors into a voltage,
wherein the input signal is a voltage signal, and
the feedback signal generator generates the feedback signal comprising the voltage signal based on output of the transimpedance amplifier.

7. The analog-to-digital converter of claim 1, wherein the feedback signal generator comprises a filter to remove spurious components contained in the feedback signal, and
the differential signal is a differential signal between the input signal and a feedback signal having passed through the filter.

8. The analog-to-digital converter of claim 1, wherein the input signal is a current signal, and
the feedback signal generator comprises:
a plurality of current buffers to receive the currents output from the switched capacitors; and
a plurality of filters to remove spurious components contained in currents output from the current buffers,
wherein currents having passed through the filters are combined to generate the feedback signal.

9. The analog-to-digital converter of claim 1, wherein the input signal is a voltage signal, and
the feedback signal generator comprises:
a plurality of current buffers to convert the currents output from the switched capacitors to voltages, respectively; and a plurality of filters to remove spurious components contained in currents output from the current buffers and to convert the currents into voltages, wherein voltages having passed through the filters are combined to generate the feedback signal.

10. A signal processing apparatus comprising:

an analog-to-digital converter to convert an input signal into a digital signal; and a signal processor to perform a predetermined signal process based on the digital signal, wherein the analog-to-digital converter comprises:

a plurality of switched capacitors comprising capacitors charge or discharge according to switching of switches, the switched capacitors varying charge amount of the capacitors in accordance with (1) a frequency of an oscillation signal in accordance with a differential signal between an input signal and a feedback signal, (2) capacitance of the capacitors, and (3) a bias voltage;

a feedback signal generator to generate the feedback signal based on output signals of the switched capacitors;

a digital converter to generate the digital signal by digital conversion of the input signal based on the oscillation signal;

a differential signal generator to generate the differential signal;

an oscillator to generate the oscillation signal having a frequency in accordance with the differential signal; and a frequency divider to generate frequency division signals having a frequency equal to or lower than the frequency of the oscillation signal to supply the frequency division signals to the switched capacitors, the frequency division signals having different phases.

11. The signal processing apparatus of claim 10, wherein the switched capacitors outputs currents in accordance with the bias voltage and the charge amount of the capacitors, as the output signal, and the feedback signal generator generates the feedback signal based on the currents output from the switched capacitors.

12. The signal processing apparatus of claim 10 further comprising:

wherein the switched capacitors repeat the charging and discharging of the capacitors in accordance with the frequencies of the frequency division signals.

13. The signal processing apparatus of claim 12, wherein the frequency divider is a counter to generate the frequency division signal and to measure a cycle number of the oscillation signal as integral phase information, and the digital converter comprises:

a time-to-digital converter to detect decimal phase information of the oscillation signal;

an adder to add the integral phase information and the decimal phase information; and a differentiator to convert an output signal of the adder into frequency information.

14. The signal processing apparatus of claim 10, wherein the input signal is a current signal, and the feedback signal generator generates a feedback signal comprising the current signal, the differential signal generator generates the differential signal comprising a current signal, and the analog-to-digital converter further comprising a loop filter to generate a voltage signal in accordance with the differential signal, wherein the oscillator generates the oscillation signal having a frequency in accordance with the voltage signal.

15. The signal processing apparatus of claim 10 further comprising a transimpedance amplifier to convert currents output from the switched capacitors into a voltage, wherein the input signal is a voltage signal, and the feedback signal generator generates the feedback signal comprising the voltage signal based on output of the transimpedance amplifier.

16. The signal processing apparatus of claim 10, wherein the feedback signal generator comprises a filter to remove spurious components contained in the feedback signal, and the differential signal is a differential signal between the input signal and a feedback signal having passed through the filter.

17. The signal processing apparatus of claim 10, wherein the input signal is a current signal, and the feedback signal generator comprises:

a plurality of current buffers to receive the currents output from the switched capacitors; and a plurality of filters to remove spurious components contained in currents output from the current buffers, wherein currents having passed through the filters are combined to generate the feedback signal.

18. The signal processing apparatus of claim 10, wherein the input signal is a voltage signal, and the feedback signal generator comprises:

a plurality of current buffers to convert the currents output from the switched capacitors to voltages, respectively; and a plurality of filters to remove spurious components contained in currents output from the current buffers and to convert the currents into voltages, wherein voltages having passed through the filters are combined to generate the feedback signal.

* * * * *